(12) United States Patent
Aoki et al.

(10) Patent No.: US 12,069,925 B2
(45) Date of Patent: Aug. 20, 2024

(54) DISPLAY DEVICE

(71) Applicant: Japan Display Inc., Tokyo (JP)

(72) Inventors: Hayata Aoki, Tokyo (JP); Masashi Tsubuku, Tokyo (JP); Toshinari Sasaki, Tokyo (JP)

(73) Assignee: Japan Display Inc., Tokyo (JP)

( * ) Notice: Subject to any disclaimer, the term of this patent is extended or adjusted under 35 U.S.C. 154(b) by 345 days.

(21) Appl. No.: 17/699,250

(22) Filed: Mar. 21, 2022

(65) Prior Publication Data
US 2022/0310713 A1    Sep. 29, 2022

(30) Foreign Application Priority Data

Mar. 23, 2021 (JP) ................. 2021-048643

(51) Int. Cl.
*H10K 59/35* (2023.01)
*G09F 9/33* (2006.01)
*H10K 50/828* (2023.01)

(52) U.S. Cl.
CPC ......... *H10K 59/353* (2023.02); *H10K 50/828* (2023.02); *G09F 9/335* (2021.05)

(58) Field of Classification Search
CPC ................. H10K 59/353; H10K 59/35; H10K 59/80524; H10K 59/80521; H10K 50/828; G09F 9/335
See application file for complete search history.

(56) References Cited

U.S. PATENT DOCUMENTS

2016/0315133 A1    10/2016 Sato
2018/0294428 A1*   10/2018 Nishimura ........... H10K 50/814

* cited by examiner

*Primary Examiner* — Anne M Hines
*Assistant Examiner* — Jose M Diaz
(74) *Attorney, Agent, or Firm* — Michael Best & Friedrich LLP

(57) ABSTRACT

According to one embodiment, a display device includes a first area including a pixel and a second area different from the first area, wherein the pixel includes a pixel electrode, an organic material layer including a light-emitting layer, a first common electrode, and a second common electrode having transmittance higher than that of the first insulating layer, the second area is an area not overlapping the light-emitting layer in plan view, the second area is a transparent area, and the second area does not comprise the first common electrode provided therein.

10 Claims, 10 Drawing Sheets

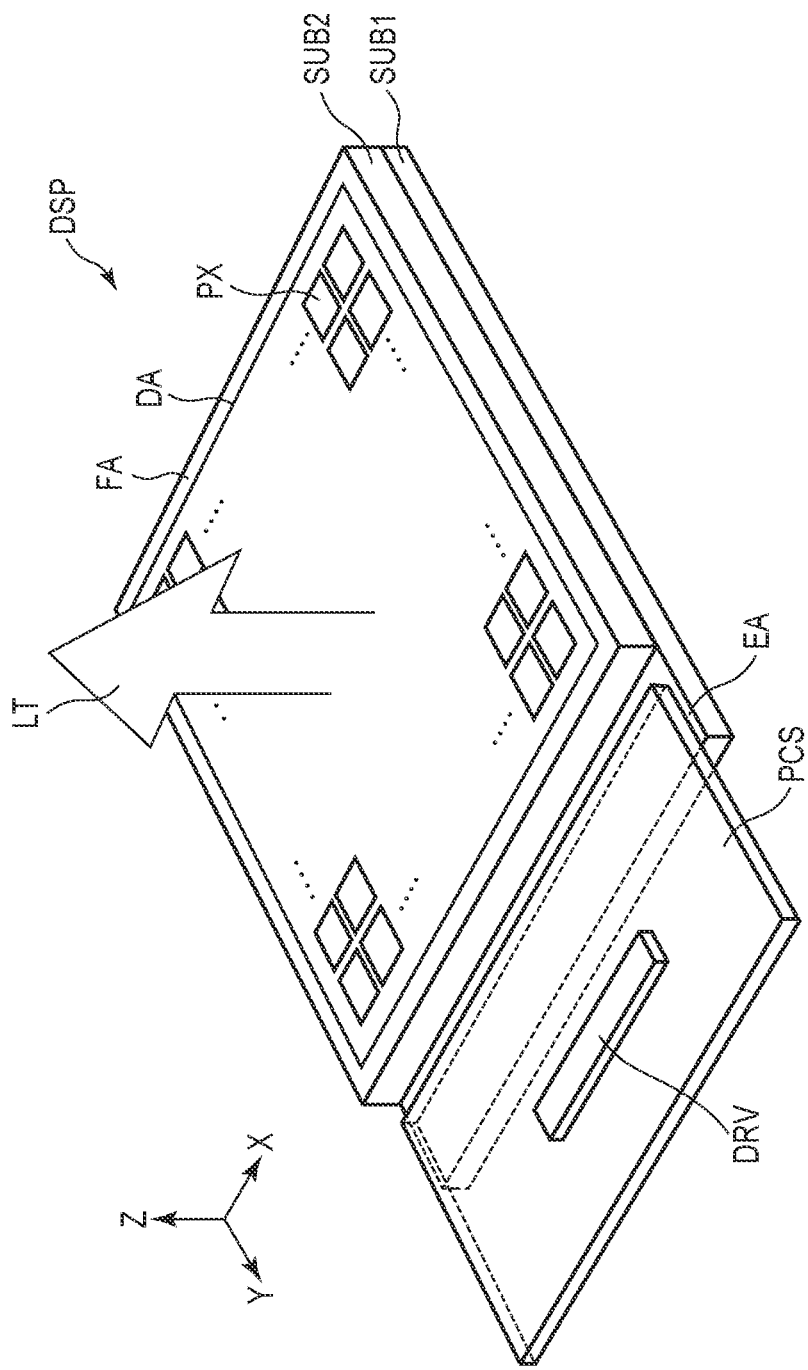
F I G. 1

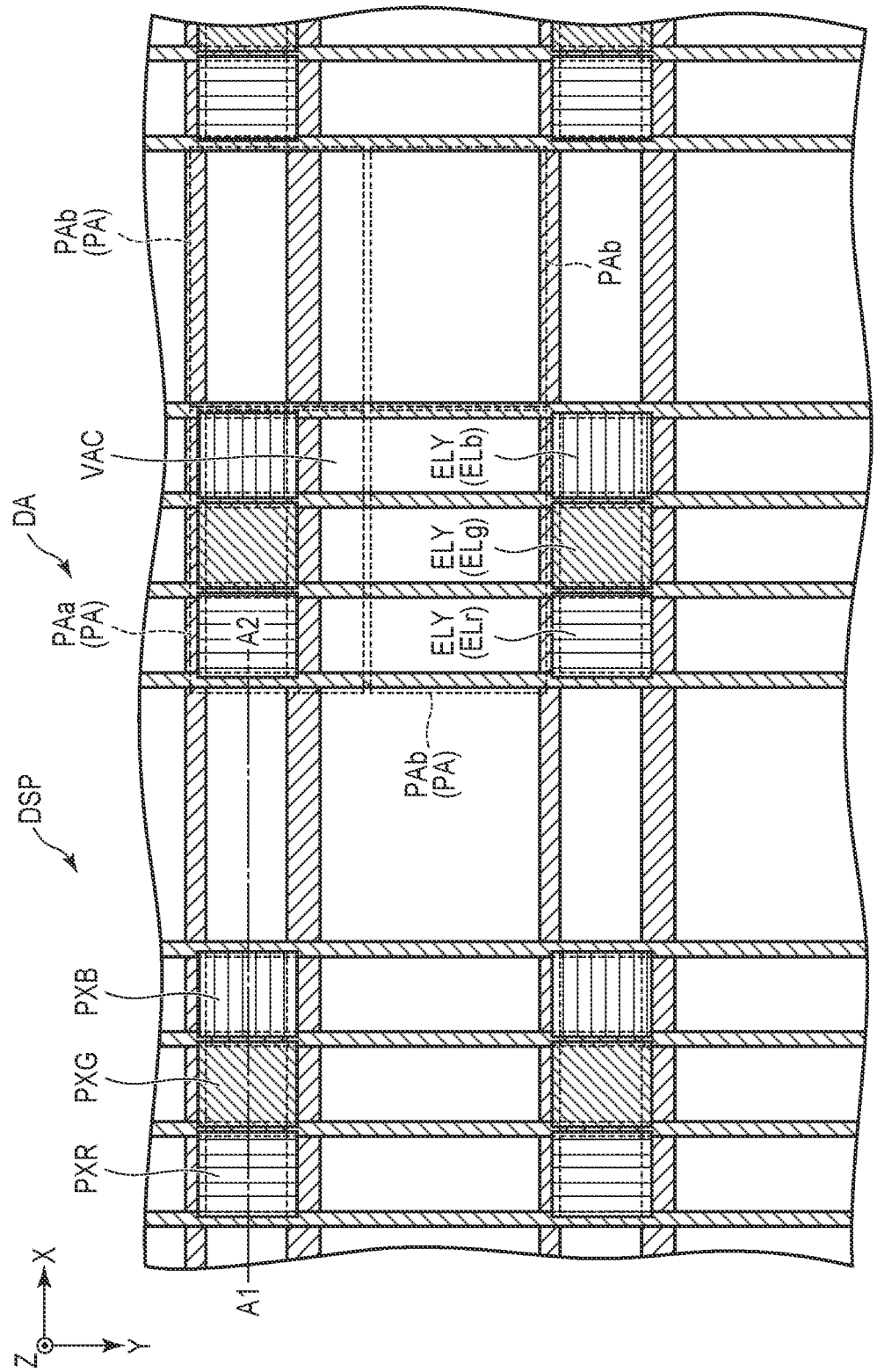
F I G. 2

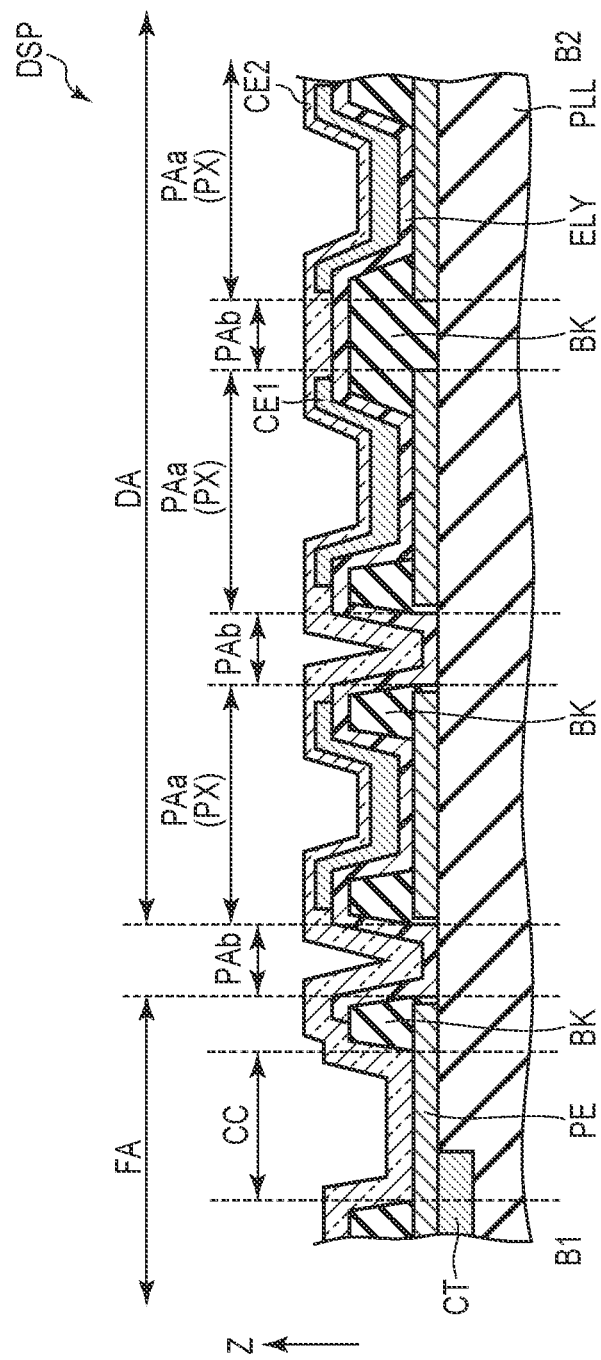
F I G. 6

DISPLAY DEVICE

CROSS-REFERENCE TO RELATED APPLICATIONS

This application is based upon and claims the benefit of priority from Japanese Patent Application No. 2021-048643, filed Mar. 23, 2021, the entire contents of which are incorporated herein by reference.

FIELD

Embodiments described herein relate generally to a display device.

BACKGROUND

A display device using an organic electroluminescence (EL) light-emitting material has been developed.

BRIEF DESCRIPTION OF THE DRAWINGS

FIG. 1 is a perspective view showing a display device of an embodiment in its entirety.

FIG. 2 is a plan view showing a display area of the embodiment.

FIG. 6 is a cross-sectional view of the display device taken along line B1-B2 in FIG. 5.

DETAILED DESCRIPTION

Figure 3:
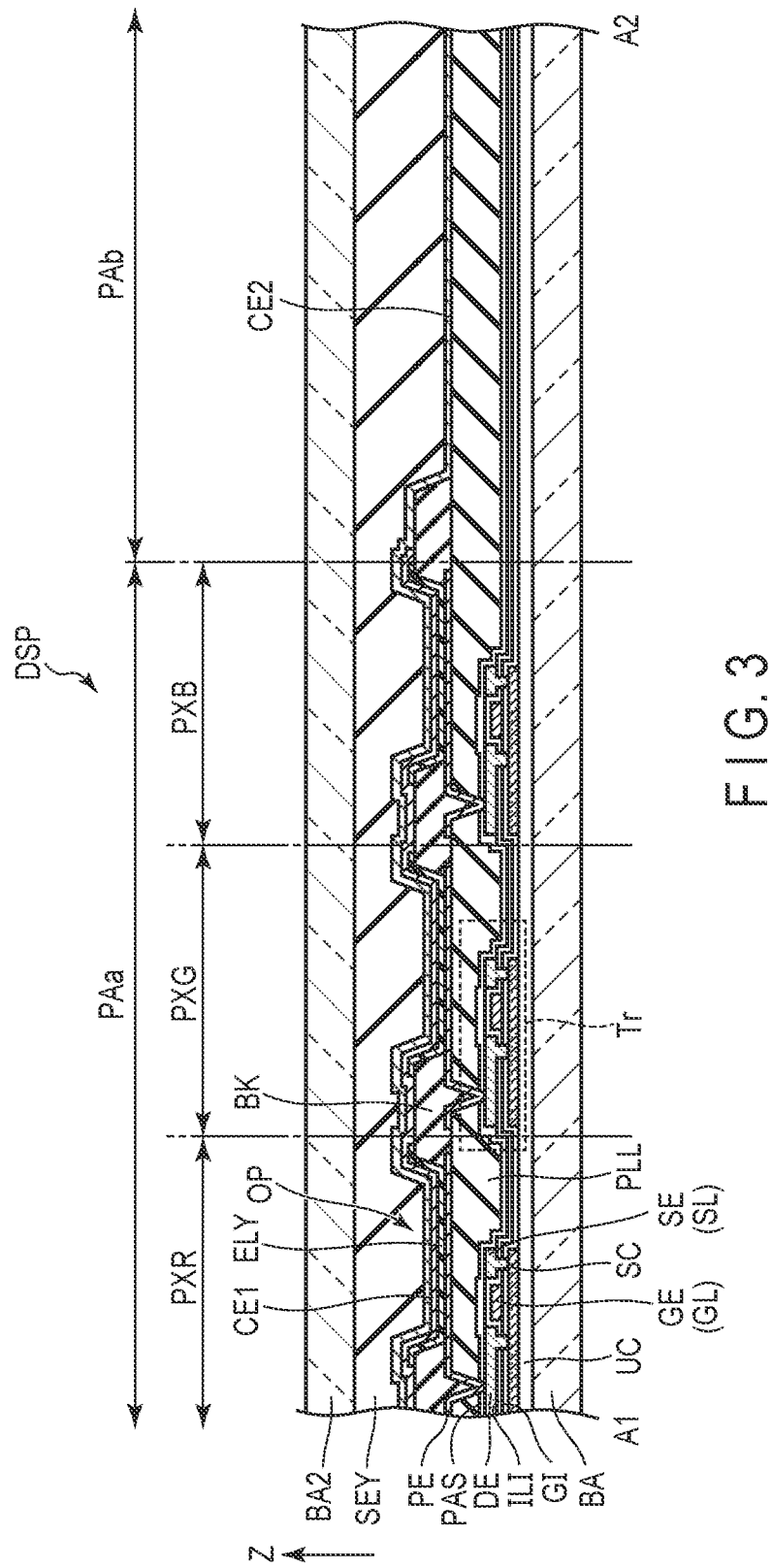
FIG. 3 is a cross-sectional view of the display device taken along line A1-A2 in FIG. 2.

In general, according to one embodiment, a display device comprises a first area including a pixel and a second area different from the first area, wherein the pixel comprises a pixel electrode, an organic material layer including a light-emitting layer, a first common electrode, and a second common electrode having transmittance higher than that of the first insulating layer, the second area is an area not overlapping the light-emitting layer in plan view, the second area is a transparent area, and the second area does not comprise the first common electrode provided therein.

According to another embodiment, a display device comprises a first area including a pixel and a second area different from the first area, wherein the pixel comprises a pixel electrode, an organic material layer including a light-emitting layer, a first common electrode, and a second common electrode having transmittance higher than that of the first insulating layer, the second area is an area not overlapping the light-emitting layer in plan view, the second area is a transparent area, and the first common electrode is provided in a part of the second area located between the first area and a first area identical to the first area and located adjacent thereto.

According to still another embodiment, a display device comprises a first area including a pixel and a second area different from the first area, wherein the pixel comprises a pixel electrode, an organic material layer including a light-emitting layer, a first common electrode including a first layer and a second layer, and a second common electrode having transmittance higher than that of the first insulating layer, the second area is an area not overlapping the light-emitting layer in plan view, the second area is a transparent area, and the second layer of the first common electrode is provided over the first area and the second area.

According to the embodiment, it is possible to provide a display device which can expand the color reproducibility range and can suppress the lowering of the transmittance.

Embodiments will be described hereinafter with reference to the accompanying drawings. Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof may be omitted unless otherwise necessary.

A display device according to one embodiment will now be described in detail with reference to accompanying drawings.

In this embodiment, a first direction X, a second direction Y and a third direction Z are orthogonal to each other, but they may intersect at an angle other than 90 degrees. In the following descriptions, a direction forwarding a tip of an arrow indicating the third direction Z is referred to as "above" or "upward" and a direction forwarding oppositely from the tip of the arrow is referred to as "below" or "downward".

With such expressions "a second member above a first member" and "a second member below a first member", the second member may be in contact with the first member or may be remote from the first member. In the latter case, a third member may be interposed between the first member and the second member. On the other hand, with such expressions "a second member on a first member" and "a second member on a first member", the second member is meant to be in contact with the first member.

In addition, it is assumed that there is an observation position to observe the semiconductor substrate on a tip side of an arrow in a third direction Z, and viewing from this observation position toward the X-Y plane defined by the first direction X and the second direction Y is referred to as a planar view. Viewing a cross section of the display device in an X-Z plane defined by the first direction X and the third direction Z or a Y-Z plane defined by the second direction Y and the third direction Z is referred to as a cross-sectional view.

Embodiment

FIG. 1 is a perspective view showing a display device of an embodiment in its entirety. The display device DSP comprises a display area DA and a peripheral area FA provided around the display area DA on a substrate SUB1. The display device DSP includes a plurality of pixels PX arranged in the display area DA. In the display device DSP, light LT from a rear surface is transmitted to a front surface and vice versa.

On an upper surface of the display area DA, a substrate SUB2 is provided as a sealing member. The substrate SUB2 is fixed to the substrate SUB1 by a sealing material (not shown) surrounding the display area DA. The display area DA formed on the substrate SUB1 is sealed by the substrate SUB2 as a sealing member, and the sealant material to prevent it from being exposed to the atmosphere.

An area EA in an end portion of the substrate SUB1 is located on an outer side of the substrate SUB2. In the area EA, a wiring substrate PGS is provided. The wiring substrate PGS is provided with a drive element DRV that outputs video signals and drive signals. The signals from the drive element DRV are input to the pixels PX in the display area DA via the wiring substrate PGS.

FIG. 2 is a plan view showing the display area of the embodiment. The display area DA shown in FIG. 2 includes a plurality of individual areas PA. The individual areas PA are arranged in a matrix along the first direction X and the second direction Y.

FIG. 2 shows as an example in which there are four individual areas PA, and one of the four individual areas PA, which is, PAa, contains a pixel PXR emitting red light, a pixel PXG emitting green light and a pixel PXG emitting blue light. The pixels PXR, PXG and PXB are provided with organic EL layers ELY including light-emitting layers ELr, ELg and ELb, respectively. Note that when there is no need to distinguish between the light-emitting layers ELr, ELg and ELb, they are referred to as light-emitting layers ELL. The light-emitting layers ELL is formed using organic electroluminescence (OEL) light-emitting material. The organic EL layers ELY will be described later.

Of the individual area PA, the region other than the pixels PX (PXR, PXG and PXB) is defined as a blank region VAC. The light-emitting layer ELL is not provided in the blank region VAC, where light is transmitted therethrough.

Those of the individual areas PA, which are different from the individual area PAa, are defined as individual areas PAb. The individual areas PAb are not provided with a light-emitting layer ELL as with the blank region VAC, and they are transparent areas through which light is transmitted. Details thereof will be described later. In this specification, the individual area PAa may as well be referred to as the first area, whereas the individual areas PAb as the second areas.

The ratio of the area occupied by the blank region VAC in the individual area PAa may be, for example, about 50% of the entire individual area PAa. For example, the occupied area occupied by one individual area PAa and that of one individual area PAb is, for example, the same. The number of individual areas PAb in the display area DA may be, for example, about three times the number of individual areas PAa.

As described above, the blank region VAC of the individual area PAa and the individual areas PAb are transparent regions. In the display device DSP of this embodiment, the area occupied by the transparent regions is greater than the area that emits light. Therefore, the display device DSP may be regarded as a transparent display.

FIG. 3 is a cross-sectional view of the display device taken along line A1-A2 in FIG. 2.

A base BA1 is made of, for example, glass or a resin material. Usable examples of the resin material are acryl, polyimide, polyethylene terephthalate, polyethylene naphthalate or the like, and further any of which may be formed in a single layer or a stacked body of multiple layers.

An insulating layer UC is provided on the base BA1. The insulating layer UC is formed, for example, by a single layer of a silicon oxide film or silicon nitride film, or a stacked layer of either one or both of these.

Transistors Tr are provided on the insulating layer UC. The transistors Tr each include a semiconductor layer SC, an insulating layer GI, a gate electrode GE (a scanning line GL), an insulating layer ILI, a source electrode SE (a signal line SL) and a drain electrode DE.

As the semiconductor layer SC, amorphous silicon, polysilicon, or oxide semiconductor is used.

As the insulating layer GI, for example, silicon oxide or silicon nitride is provided in the form of a single layer or in a staked layer.

As the gate electrode GE, for example, a molybdenum-tungsten alloy (MoW) is used. The gate electrode GE may be formed to be integrated with the scanning line GL.

The insulating layer ILI is provided to cover the semiconductor layer SC and the gate electrode GE. The insulating layer ILI is formed, for example, of a silicon oxide layer or silicon nitride layer in the form of a single layer or a stacked layer.

The source electrode SE and the drain electrode DE are provided on the insulating layer ILI. The source electrode SE and the drain electrode DE are connected to the source region and the drain region of the semiconductor layer SC via contact holes made in the insulating layer ILI and the insulating layer GI, respectively. Either one of the source electrode SE and the drain electrode DE may be formed to be integrated with the signal line SL.

An insulating layer PAS is provided to cover the source electrode SE, the drain electrode DE and the insulating layer ILI. An insulating layer PLL is provided to cover the insulating layer PAS.

The insulating layer PAS is formed of an inorganic insulating material. The inorganic insulating material may be, for example, a single layer or a stacked layer of silicon oxide or silicon nitride. The insulating layer PLL is formed of an organic insulating material. The organic insulating material is, for example, an organic material such as photosensitive acryl, polyimide, or the like. With the insulating layer PLL thus provided, stepped portions created by the transistors Tr can be planarized.

The pixel electrode PE is provided on the insulating layer PLL. The pixel electrode PE is connected to the drain electrode via contact holes made in the insulating layers PAS and PLL.

The pixel electrode PE may be of a stacked structure of a reflective first pixel electrode PE1 and a light-transparent second pixel electrode PE2. For example, as the material of the first pixel electrode PE1, silver (Ag) may be used, and as the material of the second pixel electrode PE2, indium tin oxide (ITO) or indium zinc oxide (IZO) may be used, and they may be stacked such that ITO or IZO is located at the uppermost surface of the structure. Another structure is that the pixel electrode PE may be formed in a stacked structure in which ITO or IZO, Ag, ITO or IZO are stacked in this order.

A bank BK (also called as a projecting portion, a rib or a partition wall) is provided between each adjacent pair of pixel electrodes PE. As the material of the bank BK, an organic material similar to the material of the insulating layer PLL is used. The bank BK is opened so as to expose a part of the pixel electrode PE. Further, an end portion of the opening OP should preferably have a moderately tapered shape. If the end portion of the opening OP is steeply shaped, a coverage error may occur in the organic EL layer ELY, which will be formed later.

Each organic EL layer ELY is provided between each respective adjacent pair of banks BK to overlap the respective pixel electrode PE. The organic EL layer ELY includes a hole-injection layer, a hole-transport layer, an electron blocking layer, a light-emitting layer, a hole blocking layer, an electron transport layer, an electron injection layer and the like, which will be described in detail later. In this specification, the organic EL layer ELY may as well be referred to as the organic material layer. The organic EL layer ELY includes at least a light-emitting layer, and other layers may be provided as necessary.

In order to make the drawing easier to read, FIG. 3 shows that the organic EL layer ELY is selectively provided for each pixel PX, but the configuration is not limited to this. Of the organic EL layer ELY, the light-emitting layer ELL is selectively provided for each pixel PX. Note that the other layers of the organic EL layer ELY are formed to be integrated as one body over the entire pixel PX. This will be described in detail later.

A first common electrode CE1 and a second common electrode CE2 are provided to cover the respective organic EL layer ELY and the respective bank BK. As the first common electrode CE1, a magnesium-silver alloy (MgAg) film or ytterbium-silver alloy (YbAg) film are formed as such a thin film that light emitted from the organic EL layer ELY can be transmitted though. The first common electrode CE1 is formed by co-deposition to have a film thickness of, for example, 1 nm or more but 50 nm or less. The first common electrode CE1 has both transmissive and reflective properties, and the transmittance thereof is, for example, about 40%. In this embodiment, the first common electrode CE1 may be called a semi-transmissive electrode or a semi-transparent electrode.

As the second common electrode CE2, a transparent electrode of, for example, indium tin oxide (ITO) or indium zinc oxide (IZO) is formed. The transmittance of the second common electrode CE2 is higher than the transmittance of the first common electrode CE1.

In this embodiment, the first common electrode CE is provided in the individual area PAa, but not provided in the individual areas PAb. More specifically, the first common electrode CE1 is formed into an island-like shape in the region overlapping an opening OP. Further, although not shown in the figure, the blank region VAC in the individual area PAa has a configuration similar to that of the individual areas PAb, and the first common electrode CE1 is not provided therein.

In this embodiment, the pixel electrodes PE serve as anodes and the first common electrode CE1 and the second common electrode CE2 (which may be referred to collectively as common electrodes) serve as cathodes. The light emission generated in the organic EL layer ELY is extracted upward. In other words, the display device DSP has a top emission structure.

An insulating layer SEY is provided to cover the second common electrode CE2. As will be described in detail later, the insulating layer SEY has the function of preventing moisture from entering the organic EL layer ELY from outside, and also of optical adjustment. As the insulating layer SEY, a type having high gas barrier properties is preferable. The insulating layer SEY may be, for example, a stacked layer of an organic insulating layer and an inorganic insulating layer containing nitrogen. Or, an example of the insulating layer SEY is an insulating layer in which an organic insulating layer is sandwiched between two inorganic insulating layers containing nitrogen. Further, it may be of a structure of two inorganic insulating layers are stacked one on another. Examples of the material for the organic insulating layer include acrylic resin, epoxy resin, and polyimide resin. Examples of the material for the inorganic insulating layers containing nitrogen include silicon nitride and aluminum nitride.

A base BA2 is provided on the insulating layer SEY. The base BA2 is formed of a material similar to that of the base BA1. Between the base BA2 and the insulating layer SEY, a light-transmissive inorganic insulating layer and/or organic insulating layer may be provided. The organic insulating layer may have the function of adhering the insulating layer SEY and the base BA2 to each other.

Figure 4:
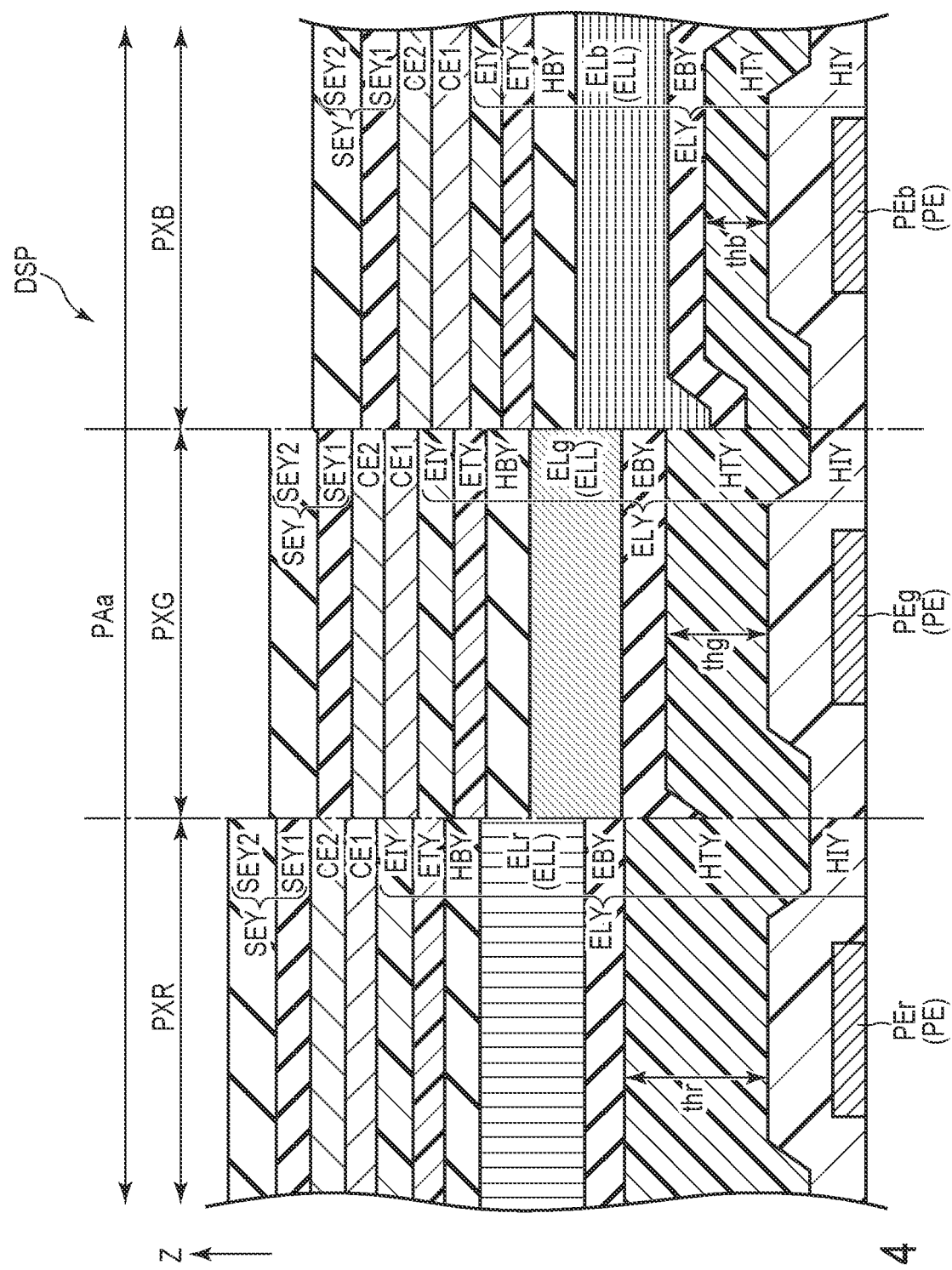
FIG. 4 is a partially enlarged view of FIG. 3.

FIG. 4 is a partially enlarged view of FIG. 3. FIG. 4 shows the structural components above the pixel electrodes PE in the pixels PXR, PXG and PXB. Note that FIG. 4 illustrates the stacked layer of each of the adjacent pixels, and the banks at the boundaries between pixels PXR, PXG and PXB are omitted from the drawing.

The pixel PXR includes, on a pixel electrode PEr, a hole injection layer HIY, a hole transport layer HTY, an electron blocking layer EBY, a light emission layer ELr (ELL), a hole blocking layer HBY, an electron transport layer ETY, an electron injection layer EIY, a first common electrode CE1, a second common electrode CE2, an insulating layer SEY1 and an insulating layer SEY2.

The pixel PXG includes, on a pixel electrode PEr, a hole injection layer HIY, a hole transport layer HTY, an electron blocking layer EBY, a light emission layer ELg (ELL), a hole blocking layer HBY, an electron transport layer ETY, an electron injection layer EIY, a first common electrode CE1, a second common electrode CE2, an insulating layer SEY1 and an insulating layer SEY2.

The pixel PXB includes, on a pixel electrode PEg, a hole injection layer HIY, a hole transport layer HTY, an electron blocking layer EBY, a light emission layer ELb (ELL), a hole blocking layer HBY, an electron transport layer ETY, an electron injection layer EIY, a first common electrode CE1, a second common electrode CE2, an insulating layer SEY1 and an insulating layer SEY2.

The hole injection layer HIY, the hole transport layer HTY, the electron blocking layer EBY, the hole blocking layer HBY, the electron transport layer ETY, the electron injection layer EIY, the first common electrode CE1, the second common electrode CE2, the insulating layer SEY1 and the insulating layer SEY3 are provided on the entire surface over the pixels PXR, PXG and PXB. They are formed as so-called solid films.

The material of the hole injection layer HIY is a material with high efficiency in injecting holes from the anode (the pixel electrode PE). The hole transport layer HTY transports the injected holes to the light emitting layer ELL. The electron blocking layer EBY stores the electrons injected from the cathode (the common electrode CE) in the light-emitting layer ELL, and prevents them from leaking out to the hole transport layer HTY.

The electron injection layer EIY injects electrons from the anode, and the electron transport layer ETY transports the injected electrons to the light-emitting layer ELL. The hole blocking layer HBY stores the holes injected from the anode in the light emitting layer ELL and prevents them from leaking out to the electron transport layer ETY.

The thickness of the hole transport layer HTY is different from one pixel PX to another. Here, let us set the thicknesses of the hole transport layers HTY in the pixels PXR, PXG and PXB to thr, thg and thb, respectively. Then, the film thicknesses thr, thg and thb satisfy the relationship thr>thg>thb. Note that the thicknesses of the hole transport layers HTY in this embodiment are not limited to these, but they can be determined as appropriate, depending on the luminous efficiency of the light-emitting layer ELL, for example.

As to the hole injection layer HIY, the electron blocking layer EBY, the hole blocking layer HBY, the electron transport layer ETY, the electron injection layer EIY, the first common electrode CE1, the second common electrode CE2, the insulating layer SEY1 and the insulating layer SEY2, the film thickness should be constant regardless of what pixel PX it is.

In the pixels PX of this embodiment, the light emitted from the light-emitting layer ELL is emitted upward or downward. The light emitted upward is extracted to the outside via the common electrode CE. The light emitted downward is reflected by the first pixel electrode PE1 of the pixel electrode PE. The reflected light is reflected between the first pixel electrode PE1 and the first common electrode CE1. With this configuration, of the light emitted by the light-emitting layer ELL, the component having a wavelength equal to the distance of the reflection path or an integral multiple of the distance, only the light component with the wavelength is amplified. As a result, light with a high peak intensity and a narrow spectrum can be extracted, and the color reproduction range of the display device DSP can be expanded (the microcavity effect).

As described above, the first common electrode CE1 is a semi-transparent electrode. The display device DSP comprising a semi-transparent electrode exhibits the microcavity effect, and with the semi-transparent electrode provided, the transparency of the display device D may be undesirably lowered. Here, the display device DSP of this embodiment is a transparent display, and therefore it is not preferable that the transmittance be lowered.

However, if the first common electrode CE1, which is a semi-transparent electrode, is not formed but only the second common electrode CE2, which is a transparent electrode, is formed, the microcavity effect is not obtained, and the color purity and luminous efficiency of the display device DSP are reduced.

Further, transparent electrodes such as of IZO have high sheet resistance. Therefore, if only the second common electrode CE2 is provided, a voltage from the power supply section disposed on the drive element DRV and the wiring substrate PGS drops, which may cause uneven brightness in the display area DA.

In this embodiment, the first common electrode CE1, which is a semi-transparent electrode, is provided only in the light-emitting region of the individual area PAa, but not in any of the blank region VAC of the individual area PAa and the individual areas PAb. With this configuration, it possible to obtain the microcavity effect and to suppress the lowering of the transmittance.

On the second common electrode CE2, the insulating layers SEY1 and SEY2 are provided. The insulating layer SEY1 is an optical adjustment layer and is an insulating layer with high refractive index. The insulating layer SEY1 is made of an inorganic or organic insulating material with, for example, a refractive index of 1.6 to 2.2 at a wavelength of 633 nm.

The insulating layer SEY2 has the function of preventing moisture from entering the organic EL layer ELY from outside. As the material for the insulating layer SEY2, for example, an inorganic insulating material containing silicon and nitrogen can be used. Note here that the insulating layer SEY2 is illustrated as a single layer, it may be formed as a stacked body of the above-mentioned insulating material containing silicon and nitrogen, or as a stacked body of another material, an insulating material containing silicon and oxygen. Further, an organic insulating material may be included as part of the stacked body.

Figure 5:
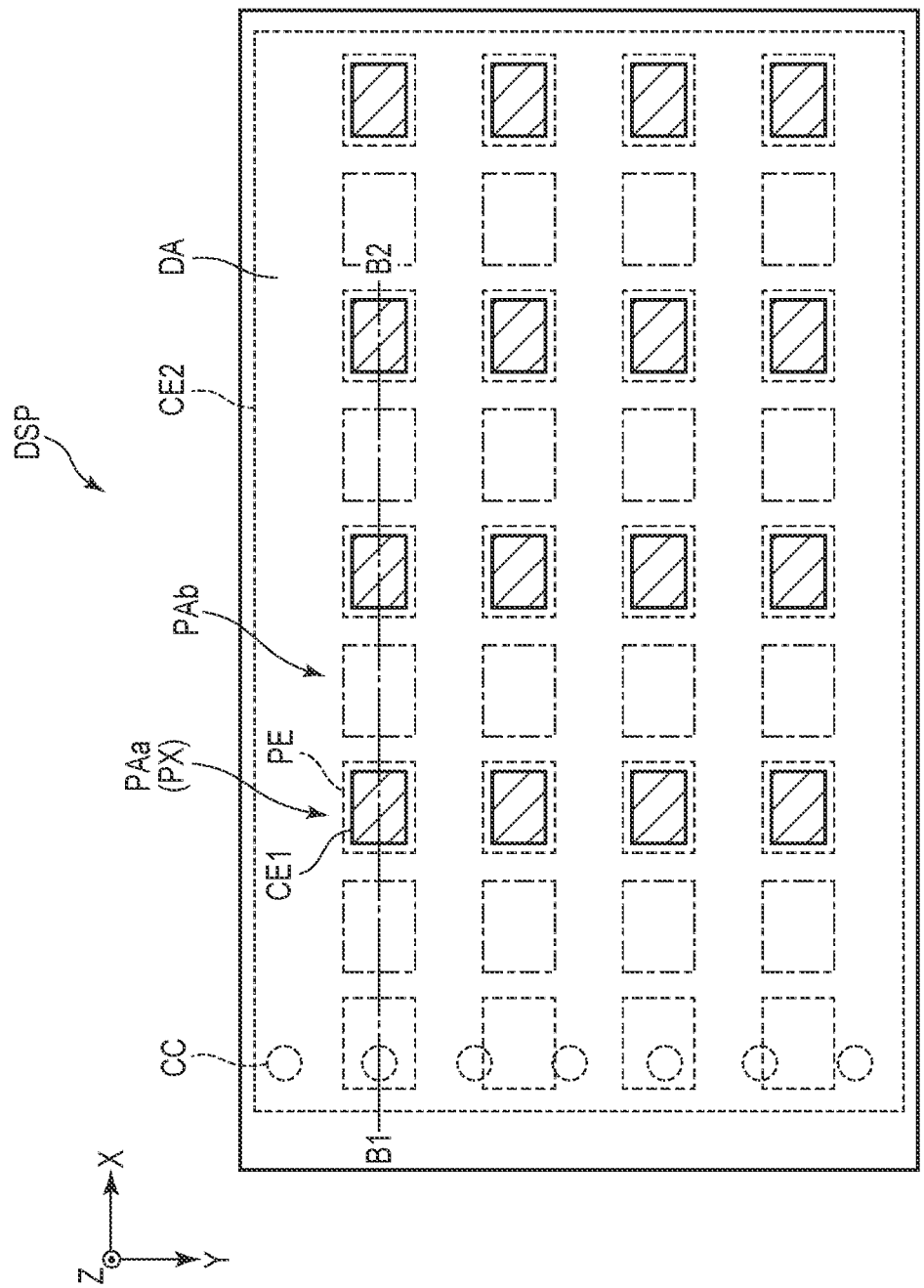
FIG. 5 is a plan view showing the display device of the embodiment.

FIG. 5 is a plan view showing the display device. FIG. 6 is a cross-sectional view of the display device taken along line B1-B2 in FIG. 5. FIG. 5 illustrates only pixel electrodes PE, first common electrodes CE1, a second common electrode CE2 and a connection region CC between the second common electrode CE2 and an external power line, of the structural components of the display device DSP. Connection regions CC are located in the peripheral area FA.

In the display device DSP shown in FIG. 5, a connection terminal CT to the power line is provided in the insulating layer PLL in each connection region CC. The pixel electrode PE provided in each connection region CC is connected to the respective connection terminal CT.

The common electrode CE2 is connected to the pixel electrodes PE provided in the peripheral area FA. These pixel electrodes PE are connected to the connection terminals CT, respectively, as described above. That is, the second common electrode CE2 is electrically connected to the connection terminals CT. Thus, the signals from the drive element DRV and the wiring substrate PGS are input to the second common electrode CE2 via the external power line. The signals are input to the pixels PX via the second common electrode CE2.

FIG. 5 illustrates one pixel PX as a typical example of the pixels PXR, PXG and PXB in the individual area PAa. Here, the blank region VAC is omitted.

In the pixel PX, a pixel electrode PE, an organic EL layer ELY and a first common electrode CE are placed between each adjacent pair of banks BK. The layers included in the organic EL layer ELY are similar to those shown in FIG. 4 and the descriptions thereof. Here, as described above, the light-emitting layer ELL in the organic EL layer ELY is provided for each pixel PX.

Each individual area PAb is provided between each respective adjacent pair of individual areas PAa. The bank BK is not provided in the individual area PAb. However, the individual area PAb is not limited to this, but it may include a bank BK. FIG. 6 illustrates an individual area with a bank BK as individual area PAb2.

The first common electrodes CE1, each of which is a semi-transparent electrode, are provided only in the respective individual areas PAa, but not in the individual areas PAb (or the areas PAb2). More specifically, the first common electrodes CE1 are formed into an island manner to overlap the pixel electrodes PE, respectively. Further, as described above, each first common electrode CE1 is provided to overlap the respective opening OP. Here, the film thickness of the first common electrode CE1 and the second common electrode CE2 combined together in the individual area PAa, the film thickness of the second common electrode CE2 in the individual area PAb, and the film thickness of the second common electrode CE2 in the peripheral area FA should preferably be the same as each other. With this configuration, a more even sheet resistance can be achieved.

The second common electrode CE2, which is a transmission electrode, is provided over the individual areas PAa and PAb (and PAb2).

With this configuration, the cavity effect can be obtained in the pixel PX, and the lowering of the transmittance, which may be caused by the semi-transmissive electrodes, can be suppressed.

As described above, according to the embodiment, it is possible to obtain a display device that can expand the color reproduction range and suppress the lowering of the transmittance.

Configuration Example 1

Figure 7:
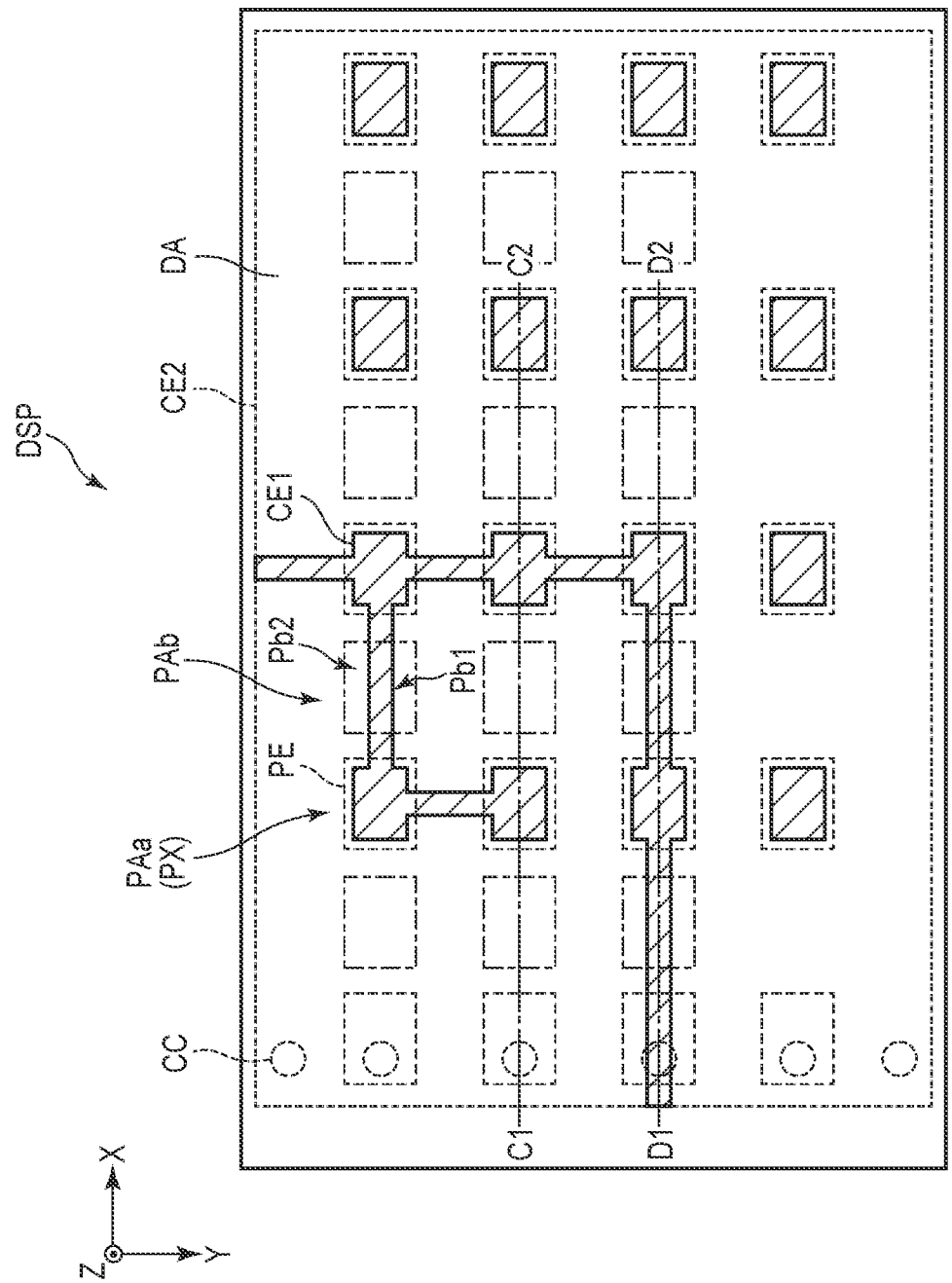
FIG. 7 is a plan view showing another configuration example of the display device of the embodiment.

FIG. 7 is a plan view showing another configuration example of the display device in the embodiment. The configuration example shown in FIG. 7 is different from that of FIG. 5 in that the first common electrode CE1 is provided as an auxiliary electrode.

Figure 8A:
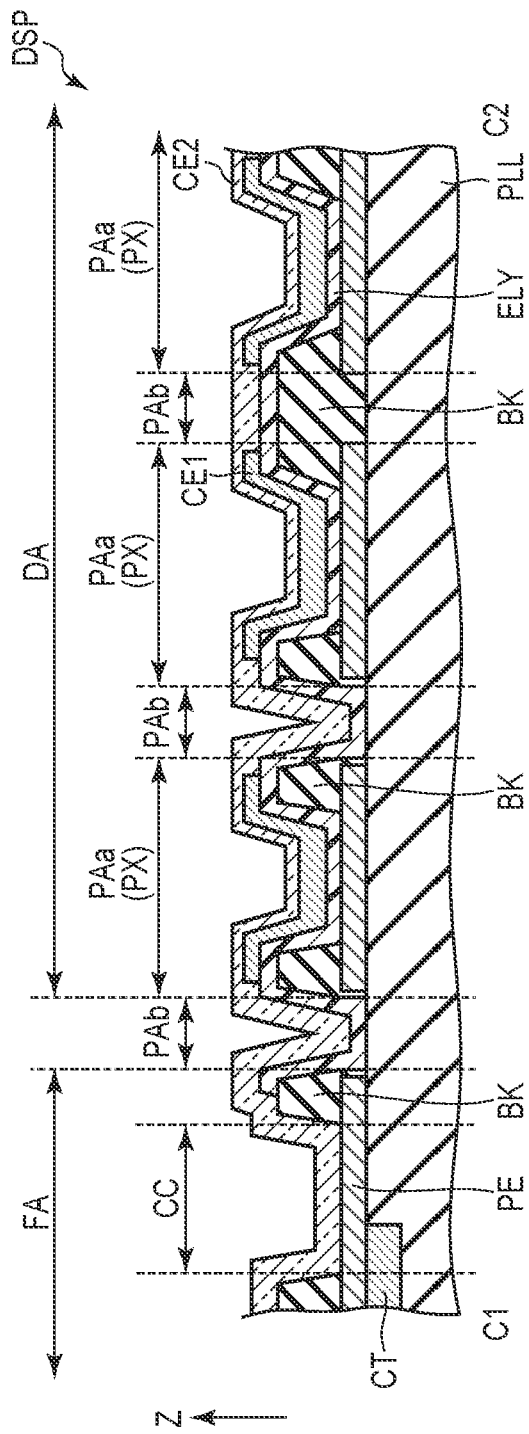
FIG. 8A is a cross-sectional view of the display device taken along line C1-C2 in FIG. 7.
Figure 8B:
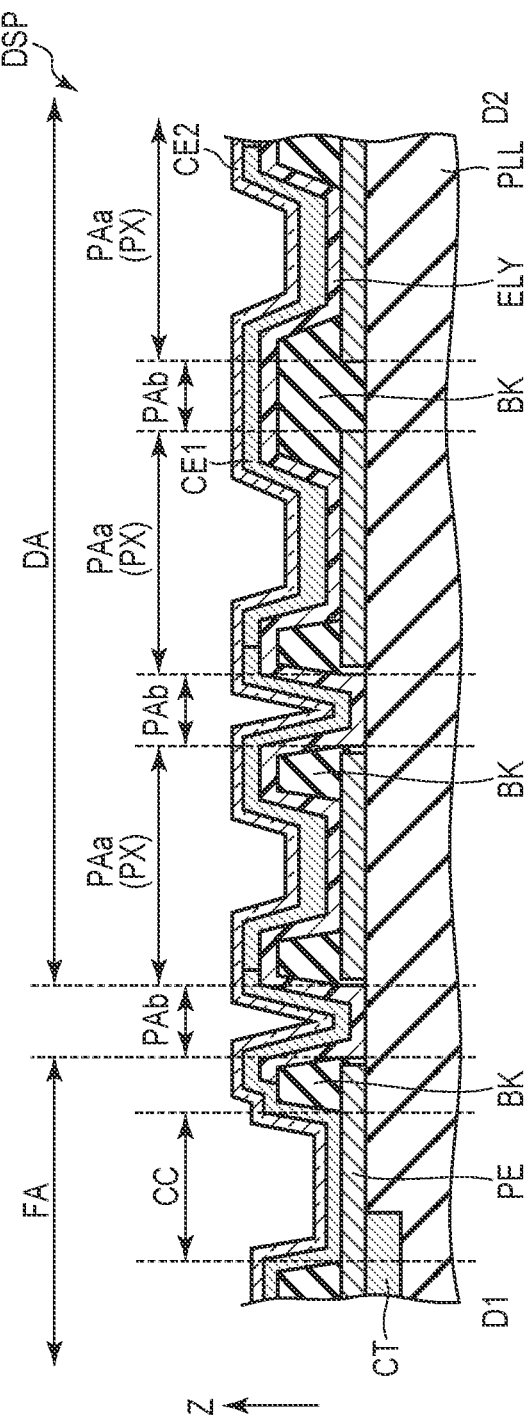
FIG. 8B is a cross-sectional view of the display device taken along line D1-D2 in FIG. 7.

FIG. 7 is a plan view of this configuration example. FIGS. 8A and 8B are cross-sectional views of the display device shown in FIG. 7. FIG. 8A is a cross-sectional view of the display device DSP taken along line C1-C2 in FIG. 7, and FIG. 8B is a cross-sectional view of the display device DSP taken along D1-D2 in FIG. 7. Note that FIG. 8A is a drawing similar to that of FIG. 7.

As shown in FIG. 8B, the first common electrode CE1 is provided not only in the respective pixel PX (the individual area PAa), but also in a part of the individual area PAb placed between the adjacent pixels PX. Here, the region of the individual area PAb, which overlaps the first common electrode CE1, is referred to as an area Pb1, and the region which does not overlap the first common electrode CE1 is referred to as an area Pb2. It is preferable that the occupying area of the area Pb1 is smaller than the occupying area of the area Pb2. This is because, if the occupying area of the area Pb1 is larger than that of the area Pb2, the transmittance is lowered. Note that the area Pb1 need not be provided in all the individual areas PAb.

It suffices if the area Pb1 is formed to be integrated with the first common electrode CE1 of the individual area PAa. For example, it suffices if a mask including openings corresponding to the individual areas PAa and Pb1 is used when the first common electrode CE1 is formed by co-deposition.

The first common electrodes CE1 provided in the respective adjacent pair of pixels PX are connected to each other by the respective first common electrode CE1 provided in the area Pb1 of the respective individual area PAb. The first common electrodes CE1 provided over the pixels PX (the individual areas PAa) and the areas Pb1 of individual areas PAb are a film integrated as one body, which is, a so-called solid film.

The first common electrodes CE1 and the second common electrode CE2 are electrically connected to the connection terminals CT with the external power line in the connection region CC of the peripheral area FA.

The second common electrode CE2, which is a transparent electrode, is formed of a metal oxide conductive material such as ITO or IZO as described above. Metal oxide conductive materials have a high sheet resistance, which may cause a drop in voltage from a power supply portion. This may results in uneven brightness in the display area DA. The first common electrode CE1, which is a semi-transparent electrode, is provided to overlap the second common electrode CE2, and used as an auxiliary electrode for the second common electrode CE2. With this configuration, it is possible to make the brightness of the display device DSP even.

In this configuration example as well, advantageous effects similar to those of the embodiment can be exhibited.

Configuration Example 2

Figure 9:
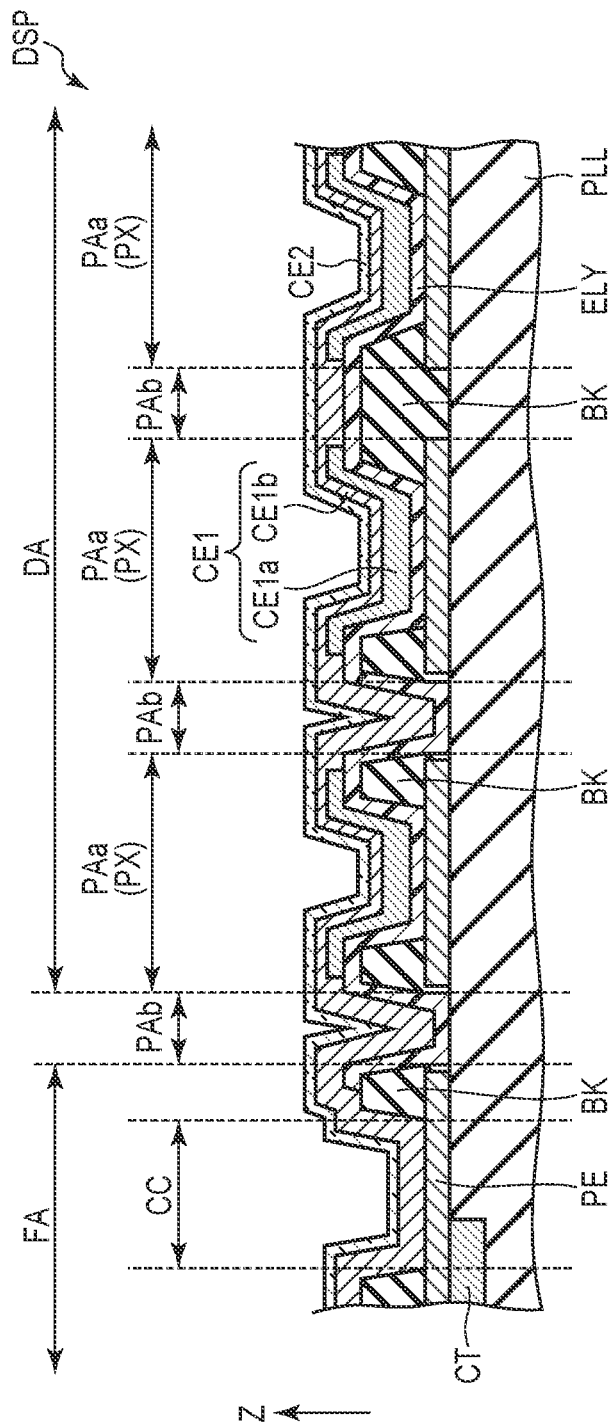
FIG. 9 is a plan view showing still another configuration example of the display device of the embodiment.

FIG. 9 is a plan view showing another configuration example of the display device in the embodiment. The configuration example shown in FIG. 9 is different from that of FIG. 6 in that the first common electrode CE1 includes two layers.

FIG. 9 is a cross-sectional view of the display device in this configuration example. A first common electrode CE1$a$ shown in FIG. 9 is the same as the first common electrode CE1 shown in FIG. 6. In FIG. 9, a third common electrode CE1$b$ is provided to cover the first common electrode CE1$a$. In this configuration example, the first common electrode CE1$a$ and the third common electrode CE1$b$ are, in some cases, referred to as the first common electrode CE1.

After forming the organic EL layer ELY and the first common electrode CE1$a$, the third common electrode CE1$b$ is formed to cover the display area DA and the peripheral area FA. In other words, the third common electrode CE1$b$ is provided to cover the individual areas PAa, the individual areas PAb, and the connection region CC. It suffices the material of the third common electrode CE1$b$ is a semi-transmissive electrode similar to that of the first common electrode CE1$a$. The third common electrode CE1$b$ is in direct contact with the first common electrode CE1$a$ and is electrically connected to the connection terminal CT with the external power supply line. With this configuration, the signals from the drive element DRV and the wiring substrate PGS are input to the pixels PX via the external power supply line and the third common electrode CE1$b$.

In the individual areas PAa, both the first common electrode CE1$a$ and the third common electrode CE1$b$ are provided. In the individual areas PAb, the third common electrode CE1$b$ is provided.

The thickness of the individual areas PAa, that is, the total of the film thicknesses of the first common electrode CE1$a$ and the third common electrode CE1$b$ in each pixel PX should preferably be 1 nm or more but 50 nm or less, at which the microcavity effect can be obtained. The film thickness of the third common electrode CE1$b$ in the individual area PAb should be determined as appropriate in consideration of the electrical resistance to the connection terminal CT.

In this configuration example, the cavity effect can be obtained by the first common electrode CE1$a$ and the third common electrode CE1$b$, and with the third common electrode CE1$b$, it is possible to electrically connect to the power supply line from outside.

Note that the example shown in FIG. 9 can be combined with the configuration illustrated in FIG. 7 described above. With the third common electrode CE1$b$ thus provided, it is possible to prevent dropping of the voltage from the power supply portion. Thus, uneven brightness in the display areas DA can be suppressed, making it possible to achieve even brightness.

Moreover, the second common electrode CE2, which is a transparent electrode, may be provided on the third common electrode CE1$b$. The third common electrode CE1$b$ also functions as an auxiliary electrode for the second common electrode CE2. Thus, uneven brightness in the display areas DA can be suppressed, making it possible to achieve even brightness.

Note that in this configuration example, for making the description easily understandable, the first common electrode CE1a, the third common electrode CE1b, and the second common electrode CE2 are referred to along the third direction Z. But, in the stacking order, the third common electrode CE1b may be referred to as the second common electrode, and the second common electrode CE2 may be referred to as the third common electrode.

Or, the first common electrode CE1a may be referred to as the first layer of the first common electrode, and the third common electrode CE1b as the second layer of the first common electrode. In that case, the second common electrode CE2 is referred to as the second common electrode.

In this configuration example as well, advantageous effects similar to those of the embodiment can be exhibited.

Configuration Example 3

Figure 10:
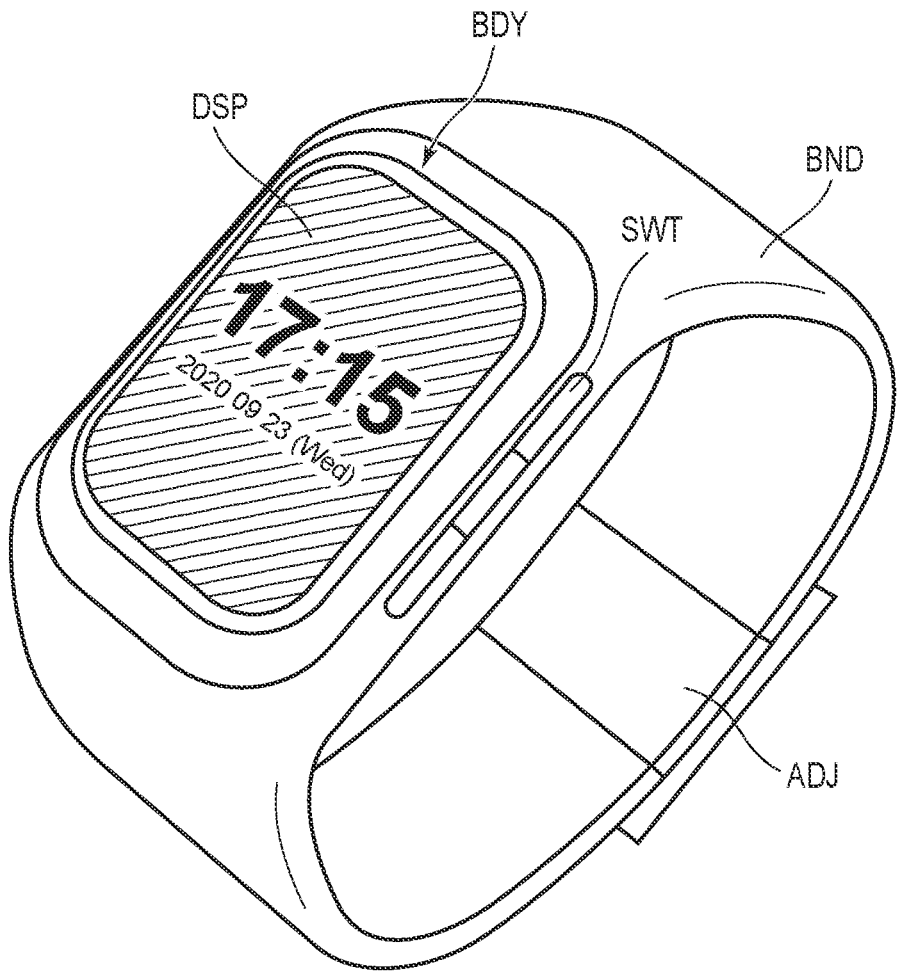
FIG. 10 is a perspective view showing an electronic apparatus using the display device of the embodiment.

FIG. 10 is a perspective diagram showing an electronic apparatus which employs the display device of the embodiment. FIG. 10 shows an electronic apparatus ERP which is a wristwatch-type electronic apparatus that can be worn on the user's arm.

The electronic apparatus ERP includes a main body BDY including a display device DSP, a band portion BND used for wearing the main body BDY on an arm, and an adjustment portion for adjusting the fastened state of the band portion BND. The main body BDY includes an operation switch SWT. The operation switch SWT is assigned to such functions as a power input switch, a display switching switch and the like.

The display device DSP is such a display device as described above that can display, for example, the date, time, and the like in colored display images, and the rest in a transparent state.

In this configuration example as well, advantageous effects similar to those of the embodiment can be exhibited.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a first area including a pixel and a second area different from the first area, wherein
the pixel comprises a pixel electrode, an organic material layer including a light-emitting layer, a first common electrode, and a second common electrode having transmittance higher than that of a first insulating layer,
the second area is an area not overlapping the light-emitting layer in plan view,
the second area is a transparent area, and
the second area does not comprise the first common electrode provided therein.

2. The display device of claim 1, wherein
the first area further includes a blank region which is different from the pixel, where the light-emitting layer is not provided, and
in the blank region, the first common electrode is not provided.

3. The display device according to claim 1, wherein
the first area and the second area constitute a display area, and
the display device further comprises:
a peripheral area provided around the display area; and
a connection terminal provided in the peripheral area, and
the second common electrode is provided over the first area and the second area and is electrically connected to the connection terminal.

4. The display device according to claim 1, wherein
the first common electrode includes a magnesium-silver alloy (MgAg) or a ytterbium-silver alloy (YbAg).

5. The display device according to claim 1, wherein
the light emitting layer includes an organic electroluminescent light emitting material.

6. The display device according to claim 1, wherein
the organic material layer includes a hole injection layer, a hole transport layer, an electron blocking layer, the light emitting layer, a hole blocking layer, an electron transport layer, and an electron injection layer.

7. A display device comprising:
a first area including a pixel and a second area different from the first area, wherein
the pixel comprises a pixel electrode, an organic material layer including a light-emitting layer, a first common electrode, and a second common electrode having transmittance higher than that of a first insulating layer,
the second area is an area not overlapping the light-emitting layer in plan view,
the second area is a transparent area, and
the first common electrode is provided in a part of the second area located between the first area and a first area identical to the first area and located adjacent thereto.

8. The display device according to claim 7, wherein
the first area and the second area constitute a display area, and
the display device further comprises:
a peripheral area provided around the display area; and
a connection terminal provided in the peripheral area, and
the first common electrode is provided in the part of the second area and is electrically connected to the connection terminal.

9. A display device comprising:
a first area including a pixel and a second area different from the first area, wherein
the pixel comprises a pixel electrode, an organic material layer including a light-emitting layer, a first common electrode including a first layer and a second layer, and a second common electrode having transmittance higher than that of a first insulating layer,
the second area is an area not overlapping the light-emitting layer in plan view,
the second area is a transparent area, and
the second layer of the first common electrode is provided over the first area and the second area.

10. The display device according to claim 9, wherein
the first area and the second area constitute a display area, and
the display device further comprises:
a peripheral area provided around the display area; and
a connection terminal provided in the peripheral area, and
the second layer of the first common electrode is electrically connected to the connection terminal.

* * * * *